(12) United States Patent
Chatwin

(10) Patent No.: US 8,208,596 B2
(45) Date of Patent: Jun. 26, 2012

(54) SYSTEM AND METHOD FOR IMPLEMENTING A DUAL-MODE PLL TO SUPPORT A DATA TRANSMISSION PROCEDURE

(75) Inventor: Jeremy Chatwin, Santa Cruz, CA (US)

(73) Assignees: Sony Corporation, Tokyo (JP); Sony Electronics Inc., Park Ridge, NJ (US)

( * ) Notice: Subject to any disclaimer, the term of this patent is extended or adjusted under 35 U.S.C. 154(b) by 857 days.

(21) Appl. No.: 11/879,088

(22) Filed: Jul. 16, 2007

(65) Prior Publication Data

US 2008/0169849 A1    Jul. 17, 2008

Related U.S. Application Data

(60) Provisional application No. 60/881,065, filed on Jan. 17, 2007.

(51) Int. Cl.
*H03D 3/24* (2006.01)
(52) U.S. Cl. ........ 375/376; 375/327; 375/373; 375/374; 331/179; 331/17; 331/34
(58) Field of Classification Search .................. 375/376, 375/156, 374, 148, 373, 327; 331/179, 17, 331/34, 11
See application file for complete search history.

(56) References Cited

U.S. PATENT DOCUMENTS

| 5,686,849 | A | 11/1997 | Burzio |
| 6,670,833 | B2 * | 12/2003 | Kurd et al. .................... 327/156 |
| 6,738,922 | B1 | 5/2004 | Warwar et al. |
| 7,369,002 | B2 * | 5/2008 | Spijker et al. .................... 331/17 |
| 2005/0062550 | A1 * | 3/2005 | Melanson .................... 331/17 |
| 2005/0174185 | A1 * | 8/2005 | Steinbach et al. ............. 331/179 |
| 2006/0141963 | A1 * | 6/2006 | Maxim et al. ............. 455/192.1 |
| 2006/0146959 | A1 * | 7/2006 | Aziz et al. .................... 375/327 |
| 2007/0002993 | A1 * | 1/2007 | Wang et al. .................... 375/374 |
| 2007/0064837 | A1 | 3/2007 | Meltzer |

FOREIGN PATENT DOCUMENTS

EP    1742359 A1    10/2007
(Continued)

OTHER PUBLICATIONS

Hyung-Rok Lee, et al., A 1.2-V-Only 900-mW 10Gb Ethernet Transceiver and XAUI Interface With Robust VCO Tuning Technique, IEEE Journal of Solid-State Circuits, vol. 40, No. 11, Nov. 2005, pp. 2148-2158.

(Continued)

*Primary Examiner* — Eva Puente
(74) *Attorney, Agent, or Firm* — Gregory J. Koerner; Redwood Patent Law

(57) ABSTRACT

A system and method for effectively utilizing a dual-mode phase-locked loop to support a data transmission procedure includes a voltage controlled oscillator that generates a receiver clock signal in response to VCO input control signals. A binary phase detector generates a BPD output signal during a BPD mode by comparing input data and the receiver clock signal. In addition, a lock-assist circuit generates a PFD output signal during a PFD mode by comparing a reference signal and a divided receiver clock signal. A loop filter performs a BPD transfer function to generate a VCO input control signal from the BPD output signal during the BPD mode. The same loop filter also performs a PFD transfer function to generate the VCO input control signal from the PFD output signal during the PFD mode.

13 Claims, 8 Drawing Sheets

FOREIGN PATENT DOCUMENTS

WO     WO2005099164 A1     10/2005

OTHER PUBLICATIONS

Yido Koo et al., A Fully Integrated CMOS Frequency Synthesizer With Charge-Averaging Charge Pump and Dual-Path Loop Filter for PCS-and Cellular-CDMA Wireless Systems, IEEE Journal of Solid-State Circuits, vol. 37, No. 5, May 2002, pp. 536-542.

Gerrit Van Werven, et al, System Laboratory Eindhoven, The Netherlands, An 99040 TEA684x Family a Nice Radio for New in Car Entertainment, Version 2.0, www.nxp.com/acrobat_download/applicationnotes/AN99040_2.pdf, Nov. 1, 2004, pp. 1-55.

* cited by examiner

Loop Filter Characteristic - BPD mode

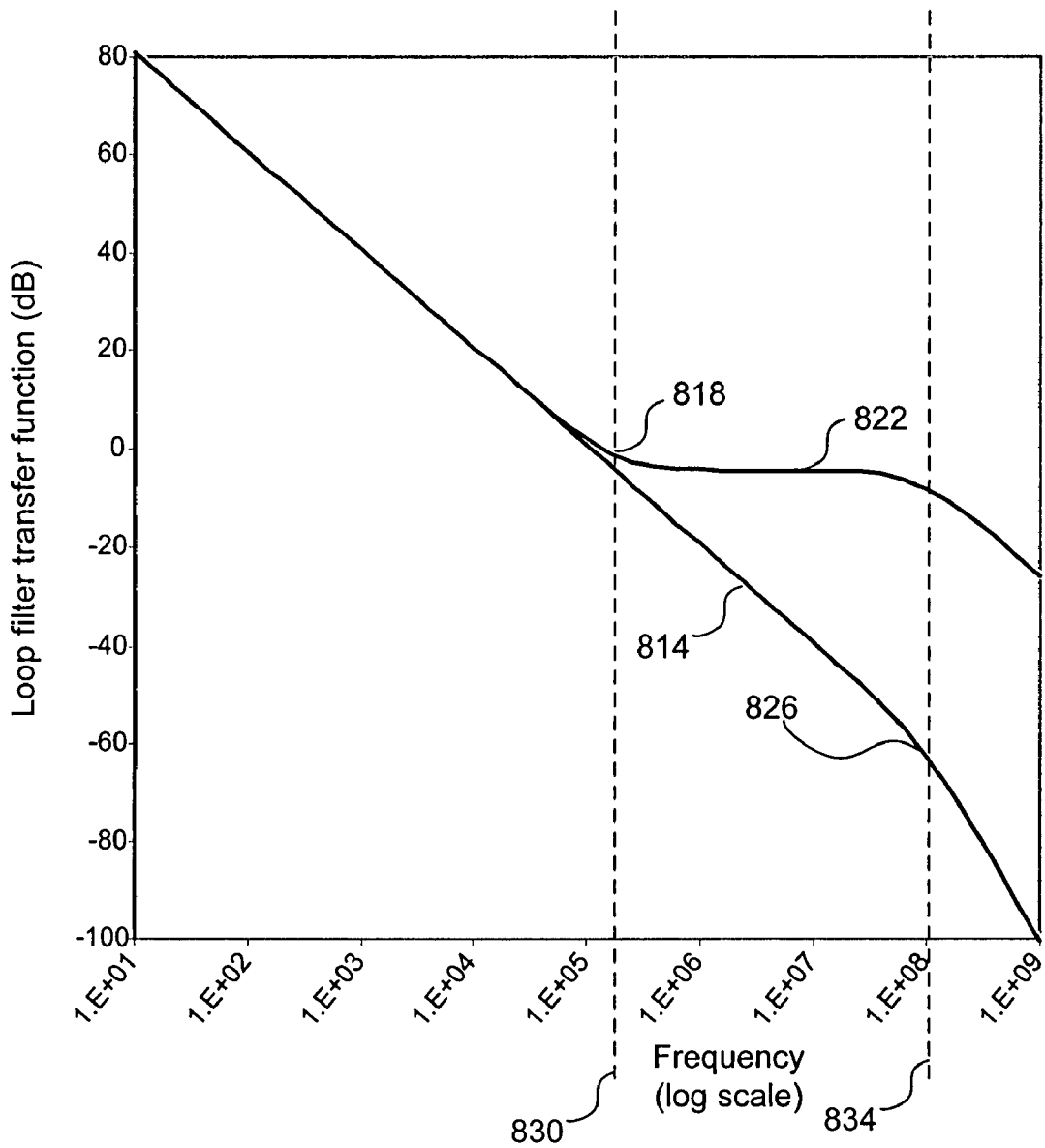
Loop Filter Characteristic - PFD mode      Fig. 8

SYSTEM AND METHOD FOR IMPLEMENTING A DUAL-MODE PLL TO SUPPORT A DATA TRANSMISSION PROCEDURE

CROSS-REFERENCE TO RELATED APPLICATION

This application claims priority in U.S. Provisional Patent Application No. 60/881,065 entitled "Dual Mode Loop Filter Connection For A Bang-Bang PLL," that was filed on Jan. 17, 2007. The foregoing related application is commonly owned, and is hereby incorporated by reference.

BACKGROUND SECTION

1. Field of the Invention

This invention relates generally to techniques for transferring electronic information, and relates more particularly to a system and method for effectively implementing a dual-mode phase-locked loop to support a data transmission procedure.

2. Description of the Background Art

Implementing effective methods for transferring electronic information is a significant consideration for designers and manufacturers of contemporary electronic systems. However, effectively implementing data transfer systems may create substantial challenges for system designers. For example, enhanced demands for increased system functionality and performance may require more system processing power and require additional hardware resources. An increase in processing or hardware requirements may also result in a corresponding detrimental economic impact due to increased production costs and operational inefficiencies.

Furthermore, enhanced system capability to perform various advanced transfer operations may provide additional benefits to a system user, but may also place increased demands on the control and management of various system components. For example, an enhanced electronic system that effectively transfers digital image data may benefit from an effective implementation because of the large amount and complexity of the digital data involved.

Due to growing demands on system resources and substantially increasing data magnitudes, it is apparent that developing new techniques for implementing and utilizing data transfer systems is a matter of concern for related electronic technologies. Therefore, for all the foregoing reasons, developing effective systems for transferring electronic information remains a significant consideration for designers, manufacturers, and users of contemporary electronic systems.

SUMMARY

In accordance with the present invention, a system and method are disclosed for effectively implementing a dual-mode phase-locked loop to support a data transmission procedure. In accordance with one embodiment, the present invention includes a method of multiplexing the outputs of a binary phase detector (BPD) and a phase frequency detector (PFD) in a dual-mode phase-locked loop (PLL). Both the BPD and the PFD share the same loop filter components (including a passive network), but are configured in such a way as to each exhibit different characteristic transfer functions.

In one embodiment, the PLL includes a BPD feedback loop comprising the BPD, a BPD charge pump, a loop filter, and a voltage controlled oscillator (VCO). In certain embodiments, the loop filter includes a primary capacitor, a secondary capacitor, and a damping resistor. The VCO generates a receiver clock under the control of this BPD feedback loop. The VCO clock output and the receiver input data are connected to the BPD which then computes the instantaneous phase error between the input data and the receiver clock.

The BPD output signal is then filtered using the loop filter. The output of the loop filter drives the input of the VCO. Over time, the action of this closed loop is to force the phase error between the VCO clock output and the receiver input data to be minimized. Once the phase error has been minimized, the PLL is said to be "in lock." Once in lock, the PLL is capable of tracking slowly-varying changes in the frequency/phase of the receiver input data, provided that these changes occur at a frequency that is lower than the loop bandwidth of the PLL.

In certain embodiments, the PLL has a property called a "lock-in range" or "pull-in range." This refers to the maximum initial difference in frequency between the VCO clock output and the rate of the receiver input data for which the PLL can achieve a lock state. This pull-in range is approximately related to the PLL loop bandwidth. Often the required PLL loop bandwidth is determined by other system parameters, and may be much lower than the expected variation in initial frequency difference. Therefore, under certain conditions, the PLL may be unable to achieve lock and system operation will fail.

To overcome this failure, it is assumed that the expected input data is close to some multiple of a local reference frequency. Therefore, a lock-assist circuit may be implemented to determine the frequency difference between the VCO clock output divided down by a predetermined factor and the local reference frequency. If the frequency difference exceeds some preset difference factor, then the PLL is switched into PFD mode by a lock detector circuit.

In PFD mode, the BPD is disabled, and a PFD is used to complete the PLL. The feedback action of the PLL with the PFD activated serves to force the frequency of the VCO clock output to some multiple of the reference frequency. This, by design, is similar to the expected frequency of the receiver input data. When the PLL is deemed to be sufficiently close to the expected frequency of the receiver input data, then the PFD is disabled by lock detector circuit, and the normal data BPD is enabled by the lock detector circuit, thus allowing the PLL to again lock to the receiver input data.

The PLL is therefore implemented using both a BPD for normal clock-recovery (BPD mode), and a PFD for lock-assist (PFD mode). To maintain stability the closed-loop PLL transfer function should provide the same or similar characteristics in both the BPD mode and the PFD mode, and should also exhibit a second-order characteristic with damping. In accordance with the present invention, the realization of this equation is electrically different for the two modes. For example, the PFD mode requires an extra damping resistor to provide the damping part of the equation. However, the extra damping resistor may impair PLL performance in the BPD mode. Therefore, the present invention specifies a damping resistor connection that is transparent for the BPD mode.

The passive network of the loop filter thus has different transfer functions depending on the currently-active mode. In BPD mode, the passive network is predominantly an integrator as the proportional path is provided externally to the passive network. In PFD mode, the passive network exhibits the full integration and proportional characteristic. For at least the foregoing reasons, the present invention therefore provides an improved system and method for effectively implementing a dual-mode phase-locked loop to support a data transmission procedure.

BRIEF DESCRIPTION OF THE DRAWINGS

FIG. 8 is a graph illustrating exemplary loop filter characteristics for the PFD mode of FIG. 7, in accordance with one embodiment of the present invention.

DETAILED DESCRIPTION

The present invention relates to an improvement in data transmission systems. The following description is presented to enable one of ordinary skill in the art to make and use the invention, and is provided in the context of a patent application and its requirements. Various modifications to the disclosed embodiments will be readily apparent to those skilled in the art, and the generic principles herein may be applied to other embodiments. Thus, the present invention is not intended to be limited to the embodiments shown, but is to be accorded the widest scope consistent with the principles and features described herein.

The present invention is described herein as a system and method for effectively utilizing a dual-mode phase-locked loop to support a data transmission procedure, and includes a voltage controlled oscillator that generates a receiver clock signal in response to VCO input control signals. A binary phase detector generates a BPD output signal during a BPD mode by comparing input data and the receiver clock signal. In addition, a lock-assist circuit generates a PFD output signal during a PFD mode by comparing a reference signal and a divided receiver clock signal. A loop filter performs a BPD transfer function to generate a VCO input control signal from the BPD output signal during the BPD mode. The same loop filter also performs a PFD transfer function to generate the VCO input control signal from the PFD output signal during the PFD mode.

Figure 1:
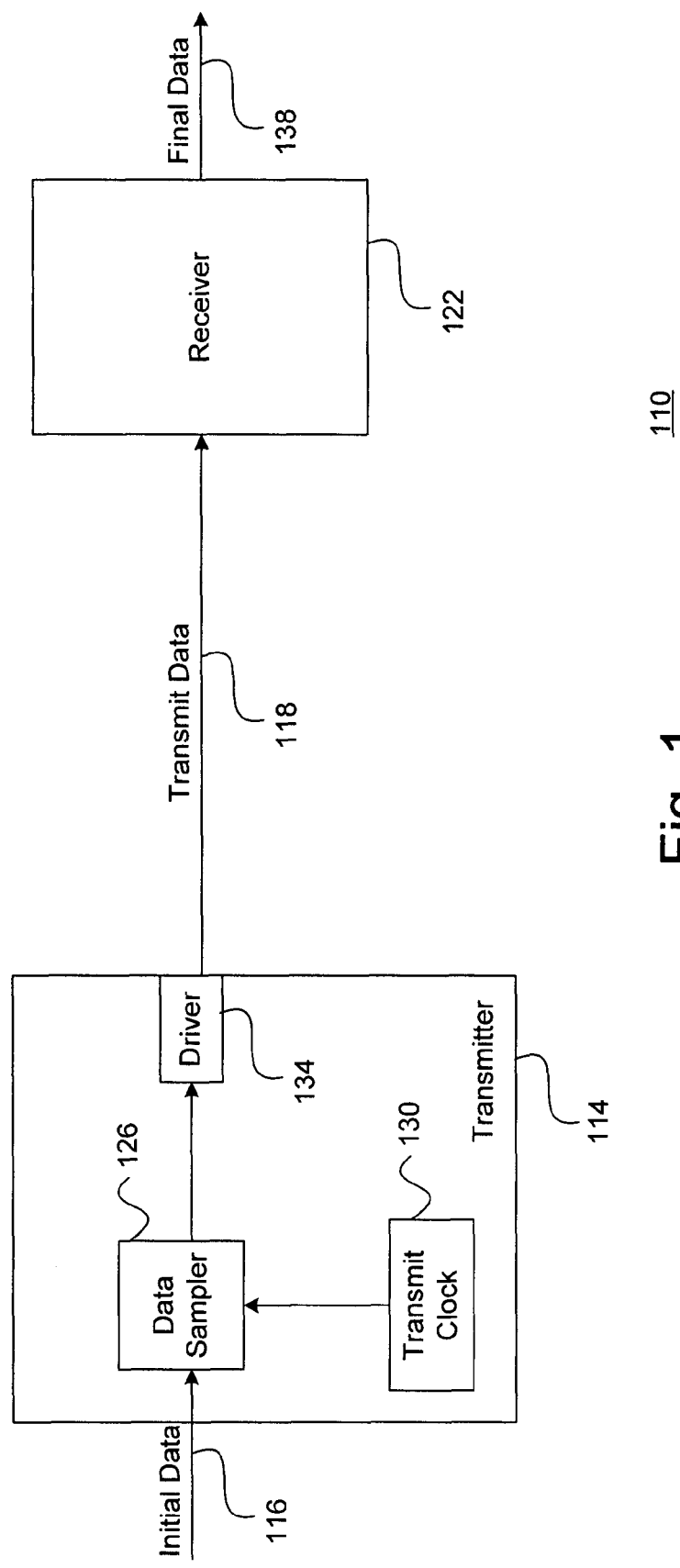
FIG. 1 is a block diagram of a data transmission system, in accordance with one embodiment of the present invention.

Referring now to FIG. 1, a block diagram of a data transmission system 110 is shown, in accordance with one embodiment of the present invention. In the FIG. 1 embodiment, data transmission system 110 includes, but is not limited to, a transmitter 114 and a receiver 122. In alternate embodiments, data transmission system 110 may be implemented using components and configurations in addition to, or instead of, certain of those components and configurations discussed in conjunction with the FIG. 1 embodiment.

In the FIG. 1 embodiment of data transmission system 110, a transmitter 114 utilizes a data sampler 126 to receive initial data 116 from any appropriate data source. Data sampler 126 synchronizes the initial data 116 with reference to a transmit clock 130. A driver 134 then outputs the synchronized initial data 116 over any appropriate type of transmission channel as transmit data 118. A receiver 122 of data transmission system 110 may then receive and process the transmit data 118 to thereby provide final data 138 to any appropriate data destination.

Data transmission system 110 may thus transfer any desired type of electronic data or information between two separate locations via a transmission channel. These locations may be considerably distant (for example, between continents or between satellites), or may alternately be relatively close to each other (for example, between devices inside electronic equipment). A wide range of physical transmission media may be used to facilitate this transmission. Examples include electro-magnetic waves in free space (wireless transmission), or electro-magnetic waves in a constrained media (optical fiber, waveguides, cables, etc.).

This transmit data 118 is typically processed into a format that is suitable for transmission across the channel in a manner that maximizes intelligibility (a low incidence of error at the receiver 122, that has a low bit-error rate (BER), that maximizes the data throughput rate (measured in bits/second or symbols/second), and that minimizes certain cost factors such as transmission power, implementation complexity, and maximize spectral efficiency.

One method of processing involves serializing the initial data 116 before transmission, so that each data bit is represented by a unique symbol. These symbols are transmitted across the channel at a particular rate, controlled by transmit clock 130 of transmitter 114. Various symbols may be chosen to encode the transmit data 118. Examples of such encoding techniques include Manchester bi-phase, Return-to-Zero (RZ), and Non-Return-to-Zero (NRZ), etc. Of the binary encoding techniques, NRZ is more spectrally efficient because, for a given channel capacity, it allows the maximum data rate.

To accurately receive and de-serialize these encoded symbols with a low BER, the receiver 122 may regenerate a local receiver clock that is similar to the transmit clock 130 of transmitter 114 with respect to frequency and phase. This synchronization of the receiver clock to the frequency and phase of incoming transmit data 118 may be advantageously performed by either a Phase Locked Loop (PLL) device or a Delay Locked Loop (DLL) device during a clock regeneration procedure. Further details regarding the implementation and utilization of receiver 122 are further discussed below in conjunction with FIGS. 2-8.

Figure 2:
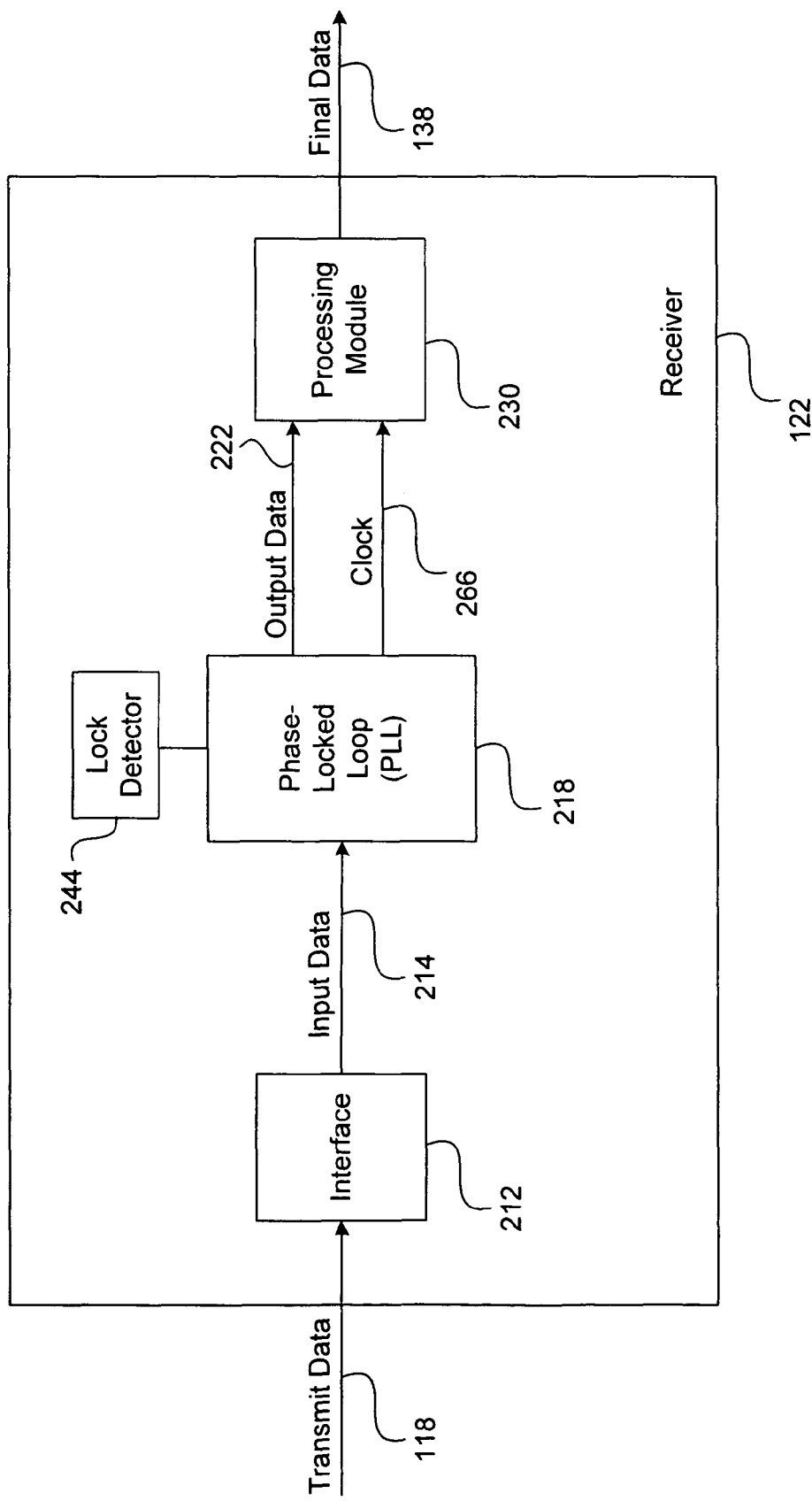
FIG. 2 is a block diagram for one embodiment of the receiver of FIG. 1, in accordance with the present invention.

Referring now to FIG. 2, a block diagram for one embodiment of the FIG. 1 receiver 122 is shown, in accordance with the present invention. In the FIG. 2 embodiment, receiver 122 may include, but is not limited to, an interface 212, a phase-locked loop (PLL) 218, and a processing module 230. In alternate embodiments, receiver 122 may be implemented using components and configurations in addition to, or instead of, certain of those components and configurations discussed in conjunction with the FIG. 2 embodiment. In various embodiments, receiver 122 may be implemented as any other appropriate type of electronic device.

In the FIG. 2 embodiment, transmit data 118 may be received from any desired data source, and may be encoded in any appropriate data format. For example, in certain embodiments, transmit data 118 may be received from a transmitter 114 of a data transmission system 110 (FIG. 1). In the FIG. 2 embodiment, an interface 212 of receiver 122 converts transmit data 118 into corresponding input data 214. In certain embodiments, input data 214 may be encoded according to an NRZ encoding technique.

In the FIG. 2 embodiment, a phase-locked loop (PLL) 218 receives input data 214, and responsively performs a clock regeneration procedure to produce a clock signal 266. A processing module 230 may receive output data 222 and clock 266 for performing any appropriate processing procedures to thereby produce final data 138. In certain embodiments, PLL 218 may alternately be implemented as a delay-locked loop (DLL). Certain additional details for the implementation and utilization of PLL 218 are further discussed below in conjunction with FIGS. 3-8.

Figure 3:
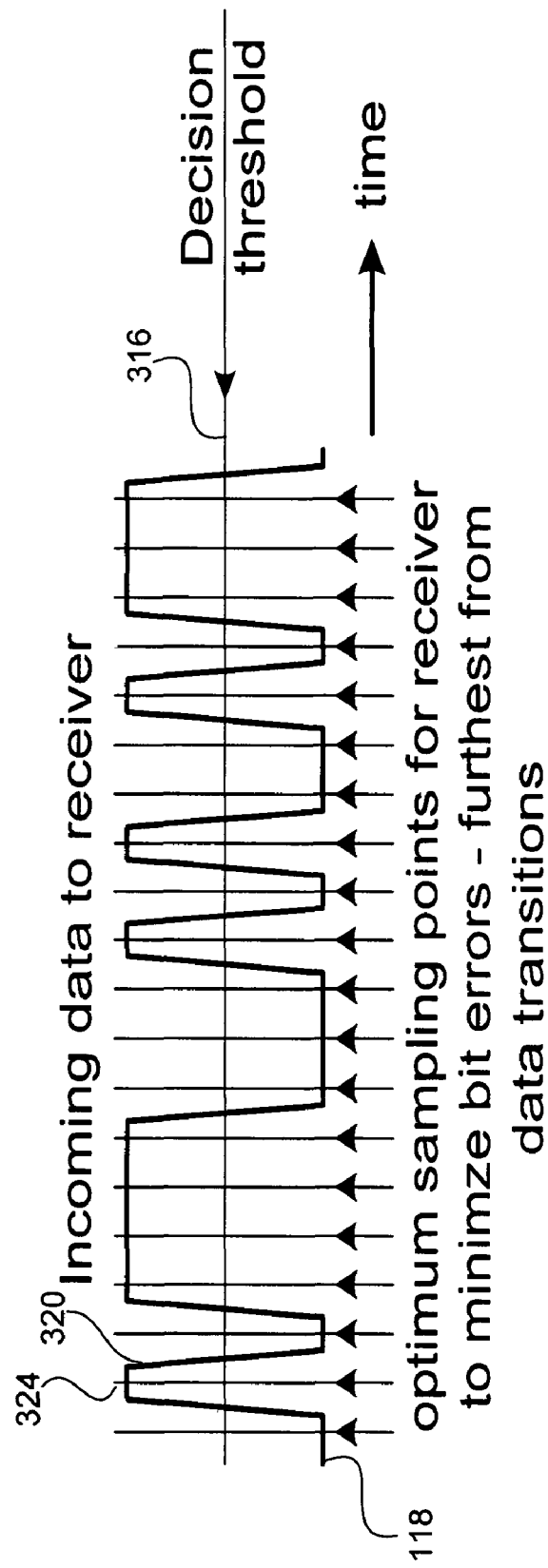
FIG. 3 is a diagram illustrating optimum data sampling points, in accordance with one embodiment of the present invention.

Referring now to FIG. 3, a diagram illustrating optimum data sampling points is shown, in accordance with one embodiment of the present invention. The FIG. 3 diagram is presented for purposes of illustration, and in alternate embodiments, the present invention may utilize techniques and timing relationships in addition to, or instead of, certain of those techniques and timing relationships discussed in conjunction with the FIG. 3 embodiment.

In the FIG. 3 embodiment, exemplary pulses of incoming data 118 to receiver 122 (FIG. 1) are shown. A decision threshold 316 for determining either a high or low state for incoming data 118 is also shown. The FIG. 3 embodiment also shows a sequence of optimal sampling points for receiver 122 to read the current state of the pulses of incoming data 118. For example, the FIG. 3 diagram shows a first pulse 320 of incoming data 118 aligned with a corresponding optimum sampling point that occurs at time 324.

Because of various potential types of noise, transition edge skewing, jitter, and other signal artifacts on the rising or falling transitions of incoming data 118, receiver 122 requires a regenerated clock 266 that aligns incoming data 118 so that the data sampling points occur during the middle of the corresponding data pulses (away from the respective transition edges). To accurately determine the clock phase error, receiver 122 must make a decision regarding the temporal position of an incoming data transition with respect to the receiver local clock 266.

Therefore, receiver 122 defines one or more decision thresholds 316, and when the incoming data 118 crosses decision threshold 316, receiver 122 is able to determine phase information. Receiver 122 may thus align the receiver local clock 266 (FIG. 2) to the optimum time position with respect to the incoming data 118. The receiver local clock 266 is then able to sample the incoming data 118, and then using the same or another decision threshold 316, make a determination as to the state of the received bits. The FIG. 3 diagram illustrates the relationship between the incoming data 118 and the optimum sampling points aligned with the regenerated phase-locked clock 266 of receiver 122. As discussed above, the optimum sampling points are in the center of the pulses of the incoming data 118. In other words, the optimum sampling points are at locations furthest from the adjacent data transitions.

Figure 4:
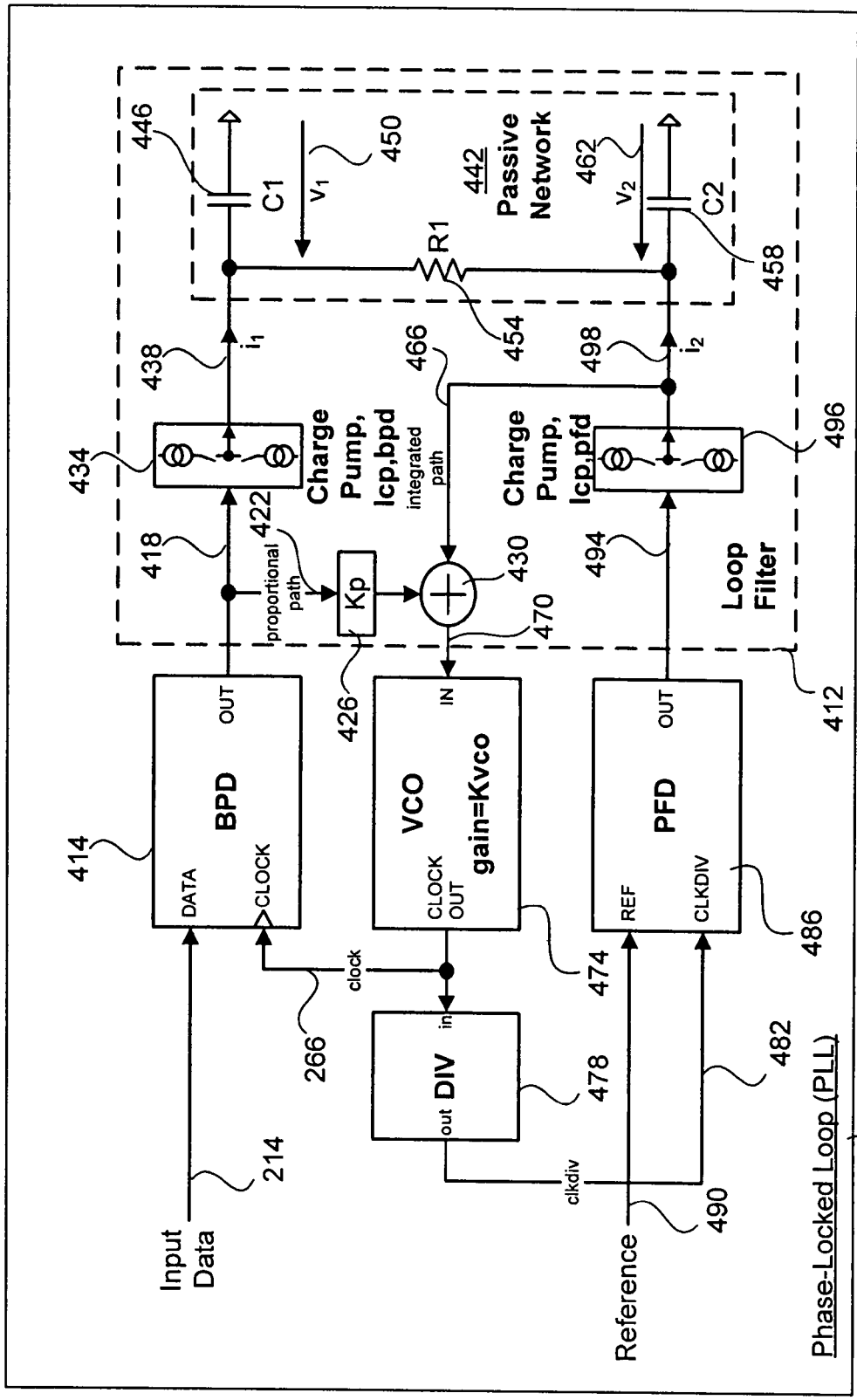
FIG. 4 is a schematic diagram for one embodiment of the phase-locked loop from FIG. 2, in accordance with the present invention.

Referring now to FIG. 4, a block diagram for one embodiment of the FIG. 2 phase-locked loop (PLL) 218 is shown, in accordance with the present invention. In alternate embodiments, PLL 218 may be implemented using components and configurations in addition to, or instead of, certain of those components and configurations discussed in conjunction with the FIG. 5 embodiment.

In accordance with the FIG. 4 embodiment, the present invention includes a method of multiplexing the outputs of two different phase detectors (binary phase detector (BPD) 414 and phase frequency detector (PFD) 486) inside of one PLL 218. Both phase detectors share the same loop filter 412 components but are connected in such a way as to each exhibit different characteristic equations but of the same general form. This allows the dynamic characteristics of PLL 218 to be different depending on which phase detector is currently active.

In various embodiments, PLL 218 may be utilized to generate some form of clock signal 266 that is locked to an external reference frequency. One PLL application is the generation and synchronization of a local receiver clock 266 to an incoming digital data stream of input data 214. The correctly synchronized receiver clock 266 allows the receiver 122 (FIG. 1) to recover and process the input data 214 to allow the maximum intelligibility and the lowest number of errors.

In the FIG. 4 embodiment, PLL 218 includes a BPD feedback loop comprising a binary phase detector (BPD) 414, a BPD charge pump 434, a loop filter 412, and a voltage controlled oscillator (VCO) 474. The VCO 474 generates the receiver clock 266 under the control of this feedback loop. The VCO clock output 266 and the input data 214 are connected to the BPD 414 which then computes the instantaneous phase error between the input data 214 and the clock 266.

The BPD output 418 is then filtered using the loop filter 412. The output of the loop filter 412 drives the input of the VCO 474. Over time, the action of this closed loop is to force the phase error between the VCO clock output 266 and the input data 214 to be minimized. Once the phase error has been minimized, the PLL 218 is said to be "in lock." Once in lock, the PLL 218 is capable of tracking slowly-varying changes in the frequency/phase of input data 214, provided that these changes occur at a frequency that is lower than the loop bandwidth of PLL 218.

In certain embodiments, PLL 218 has a property called a "lock-in range" or "pull-in range." This refers to the maximum initial difference in frequency between VCO clock 266 and the rate of input data 214 for which the PLL 218 can achieve a lock state. This pull-in range is approximately related to the PLL loop bandwidth. Often the required PLL loop bandwidth is determined by other system parameters, and may be much lower than the expected variation in initial frequency difference. Therefore, under certain conditions, the PLL 218 may be unable to achieve lock and system operation will fail.

To overcome this failure, it is assumed that the expected input data 214 is close to some multiple of a local reference frequency 490. Therefore, a lock-assist circuit may be implemented to determine the frequency difference between the local VCO clock 266 divided down by a predetermined factor and the local reference frequency. If the frequency difference exceeds some preset difference factor, then the PLL 218 is switched into PFD mode by a lock detector circuit.

In PFD mode, the normal data BPD 414 is disabled, and a PFD 486 is used to complete the PLL 218. The feedback action of the PLL 218 with the PFD 486 activated serves to force the frequency of VCO clock 266 to some multiple of the reference frequency 490. This, by design, is similar to the expected frequency of the input data 214. When the PLL 218 is deemed to be sufficiently close to the expected frequency of input data 218, then the PFD 486 is disabled by lock detector circuit, and the normal data BPD 414 is enabled by the lock detector circuit, thus allowing the PLL 214 to lock to the input data 214.

In the FIG. 4 embodiment, BPD 414 may be implemented as a "bang-bang" phase detector that provides a binary or tri-state output 418. In the FIG. 4 embodiment, the BPD mode therefore splits the loop filter 412 into two paths. An integration path 466 (typically made up of the capacitor C1 446) is driven by a BPD charge pump 434. A proportional path 422 is provided from the BPD 414 directly to the VCO control input 470. This allows for the PLL loop bandwidth to be high, but with greatly reduced jitter peaking. In the FIG. 4 embodiment, PLL 218 is implemented using both a BPD 414 for normal clock-recovery (BPD mode), and a PFD 486 for lock-assist (PFD mode). Two different characteristics for passive network 442 are therefore required: integrator characteristics for BPD mode, and lead-lag R-C filter characteristics for PFD mode.

Conventional second order PLL loop filters typically require that the BPD charge pump 434 be connected to C2 458. However, by connecting the BPD charge pump 434 to C1 446 and ensuring that C1 is significantly greater than C2 (for example, on the order of twenty times as large), then the BPD characteristics from the BPD charge pump 434 provide an integration process. Furthermore, the direct connection from the BPD 414 to VCO 474 via the "proportional path" 422 allows for a short feedback loop, and allows the jitter peaking to be minimized, as compared to a conventional connection.

If this direct connection were not used, then the BPD charge pump 434 would have to be connected to the $i_2$ input 498. In this case the loop filter "proportional path" is given by resistor R1 454, and the additional delay around the loop would cause jitter peaking to be increased. In BPD mode, the "proportional path" 422 connection has the same effect as the resistor "R1" 454 in a conventional charge pump PLL. Therefore, in BPD mode, the effect of R1 454 is reduced by virtue of the connections shown in the FIG. 4 embodiment.

In the BPD mode, the total charge pump current is equal to BPD charge current $i_1$ 438 because PFD charge current $i_2$ 498 is equal to zero. The open loop characteristics of passive network 442 may thus be expressed by the following equation with reference to the values shown in FIG. 4:

$$\frac{v_2}{i_1} = \frac{1}{(C_1 + C_2)s} \cdot \frac{1}{1 + R_1 \frac{C_1 C_2}{C_1 + C_2} s}$$

In the BPD mode, passive network 442 thus provides an integrator made of the sum of capacitance $C_1$ 446 and $C_2$ 462, with an additional high frequency pole dominated by $R_1$ 454 and the effective series capacitance of $C_1$ 446 and $C_2$ 462. Therefore, driving the passive network 442 with BPD charge current $i_1$ 438 causes passive network 442 to function as a low pass filter.

In PFD mode, total charge pump current is equal to $i_2$ 498 because BPD charge current $i_1$ 438 is equal to zero. The open loop characteristics of passive network 442 may thus be expressed by the following equation with reference to the values shown in FIG. 4:

$$\frac{v_2}{i_2} = \frac{1}{(C_1 + C_2)s} \cdot \frac{1 + R_1 C_1 s}{1 + R_1 \frac{C_1 C_2}{C_1 + C_2} s}$$

In the PFD mode, passive network 442 thus provides an integrator made up of the sum of capacitors $C_1$ 446 and $C_2$ 458, with the additional pole and a new zero at frequency $1/R_1 * C_1$. Therefore, driving the passive network 442 with PFD charge current $i_2$ 498 causes the passive network 442 to exhibit lead-lag characteristics, as appropriate for second order PLL loop filters. The implementation and utilization of PLL 218 are further discussed below in conjunction with FIGS. 5-8.

Figure 5:
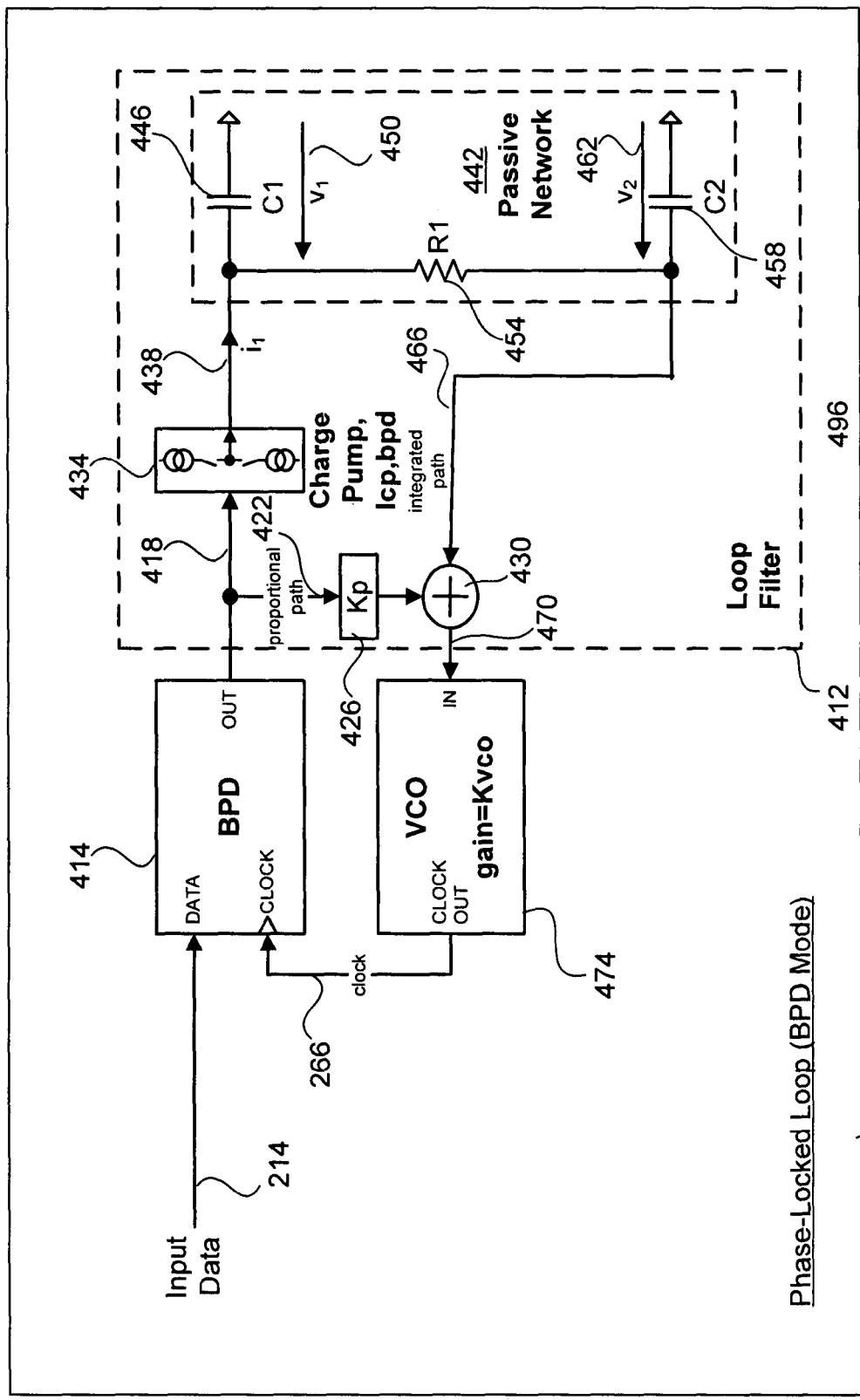
FIG. 5 is a schematic diagram for one embodiment of the phase-locked loop of FIG. 4 in a BPD mode, in accordance with the present invention.

Referring now to FIG. 5, a schematic diagram of the FIG. 4 phase-locked loop 218 in a BPD mode is shown, in accordance with one embodiment of the present invention. In alternate embodiments, the BPD mode may be implemented using components and configurations in addition to, or instead of, certain of those components and configurations discussed in conjunction with the FIG. 5 embodiment.

The FIG. 5 embodiment shows certain similarly-number components from the FIG. 4 PLL 218. However, for purposes of illustration, those components that are not currently active in the BPD mode have been removed from the FIG. 5 drawing. For example, in BPD mode, a lock detector circuit may deactivate PFD 486 (FIG. 4) and related components whenever BPD 414 is currently operating within a specified pull-in range.

During the BPD mode, PLL 218 performs a clock regeneration procedure to regenerate a clock signal 266 for synchronizing and outputting input data 214 from receiver 122 (FIG. 2) as receiver output data. In the FIG. 5 embodiment, binary phase detector (BPD) 414 initially receives input data 214 from a receiver interface 212 (FIG. 2) or any other appropriate data source. BPD 414 also receives the regenerated clock signal 266 via a feedback loop from a voltage-controller oscillator (VCO) 474. In response, BPD 414 compares the current phase relationship of input data 214 and clock 266, and responsively outputs a phase error signal 418 that represents the current phase relationship between input data 214 and clock signal 266.

During the BPD mode, the BPD output signal 418 is fed via a proportional path 422 to a summing node 430 through a gain adjustor 426. In the FIG. 5 embodiment, gain adjustor 426 or other appropriate entity may thus dynamically control the gain Kp of proportional path 422. In addition, the BPD output signal 418 also controls a BPD charge pump 434 which provides BPD charge current 438 to a passive network 442 that includes a primary capacitor C1 446, a damping resistor R1 454, and a secondary capacitor C2 462.

In the FIG. 5 embodiment, BPD charge current 438 is provided to a first end of primary capacitor C1 446, and a second end of primary capacitor C1 446 is coupled to a ground connection. In the FIG. 5 embodiment, the first end of primary capacitor C1 446 is also connected to a first end of damping resistor 454. The second end of damping resistor 454 is connected to a first end of secondary capacitor C2 458, and the second end of secondary capacitor C2 458 is coupled to the ground connection.

The values of R1 454 and C2 458 are selected so that the effect of R1 454 and C2 458 are negligible in passive network 442 during BPD mode. For example, the capacitance of C2 458 may be selected to be significantly less that the capacitance of C1 446. In certain embodiments, C1 446 may have a capacitance that is approximately twenty times the capacitance of C2 458. In the FIG. 5 embodiment, most components of PLL 218 may be implemented as part of an integrated circuit device. However, because of its relatively large size, C1 446 may be provided as an external capacitor that is not implemented within the integrated circuit device.

In BPD mode, a voltage $v_2$ 458 is provided from passive network 442 through an integrated path 466 to summing node 430 to be combined a proportional output signal from gain adjustor 426. The combined proportional/integrated feedback signal 470 is then provided as a VCO input signal to control VCO 474. In the FIG. 5 embodiment, VCO 474 then utilizes the combined proportional/integrated feedback signal 470 to dynamically control/adjust its internal operating frequency to regenerate clock signal 266 with optimal timing characteristics. The regenerated clock 266 may then be provided to BPD 414 and any other downstream components.

In the FIG. 5 embodiment, transfer function characteristics F(s) of loop filter 412 during BPD mode may be expressed by the following equation:

$$F_{BPDmode}(s) = \frac{V_{VCO,IN}}{V_{BPD,OUT}} = K_P + I_{CP,BPD}\frac{1}{(C_1+C_2)s} \cdot \frac{1}{1+R_1\frac{C_1 C_2}{C_1+C_2}s}$$

where $V_{VCO,IN}$ is the combined proportional/integrated feedback signal 470, $V_{BPD,OUT}$ is the BPD output signal 418, $K_p$ is the gain value of gain adjustor 426, and $I_{CP,BPD}$ is the BPD charge current 438. Therefore, during BPD mode, the equations exhibit a proportional term that may be expressed as $K_p$ which provides a "zero" that advantageously prevents oscillation in PLL 218. During BPD mode, the equations also exhibit an integrated term that may be expressed as $I_{CP,BPD}$ divided by C1+C2.

In certain embodiments, when C1 446 is significantly greater than C2 458, then the foregoing equation may be simplified as follows:

$$F_{BPDmode}(s) = \frac{V_{VCO,IN}}{V_{BPD,OUT}} = K_P + I_{CP,BPD}\frac{1}{C_1 s} \cdot \frac{1}{1+R_1 C_2 s}$$

The implementation and utilization of PLL 218 is further discussed below in conjunction with FIGS. 6-8.

Figure 6:
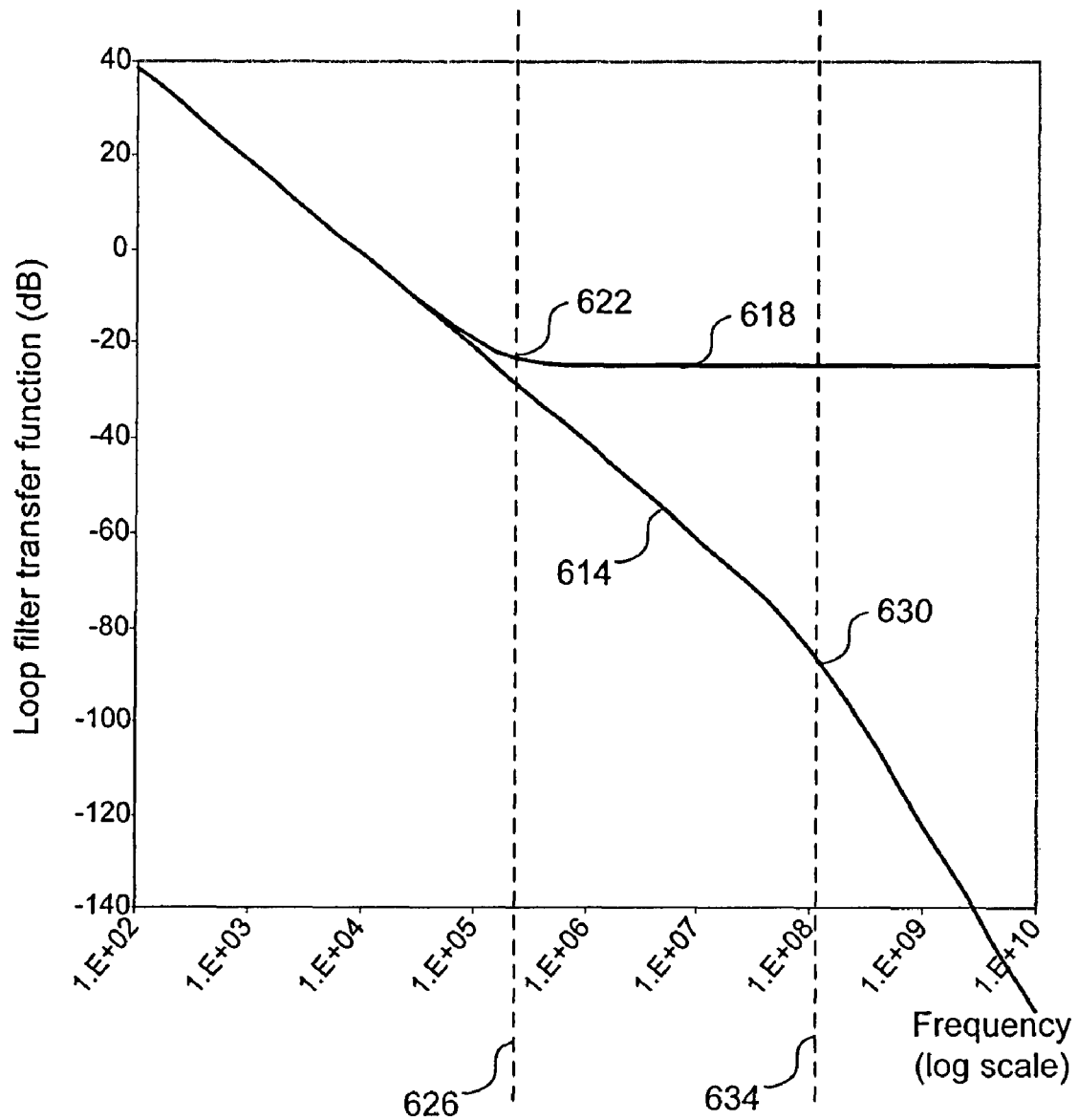
FIG. 6 is a graph illustrating exemplary loop filter characteristics for the BPD mode of FIG. 5, in accordance with one embodiment of the present invention.

Referring now to FIG. 6, a graph illustrating exemplary loop filter characteristics for the FIG. 5 BPD mode is shown, in accordance with one embodiment of the present invention. The FIG. 6 graph is presented for purposes of illustration. In alternate embodiments, the present invention may readily utilize waveforms, timing relationships, and functionalities, in addition to, or instead of, certain of those waveforms, timing relationships, and functionalities discussed in conjunction with the FIG. 6 embodiment.

In the FIG. 6 embodiment, a loop filter transfer function in decibels is shown on a vertical axis, and frequency in a logarithmic scale is shown on a horizontal axis. For purposes of illustration, the FIG. 6 graph shows a transfer function with exemplary values for various components in the FIG. 5 PLL 218. For example, C1 is approximately equal to 1.45 nF, R1 is approximately equal to 600 ohms, C2 is approximately equal to 3 pF, BPD charge current 438 is approximately equal to 80 uA, the gain Kp of gain of adjustor 426 is approximately equal to 0.0570 V/V, the zero frequency is approximately equal to 154 KHz, and the high-frequency pole due to C2 458 is approximately equal to 88.602 MHz.

In the FIG. 6 embodiment, the gain of integrated path 466 (FIG. 5) is shown as plot 614. In addition, the loop filter transfer function of loop filter 412 is shown as plot 618, and is equal to the sum of the integrated path term and the proportional path term. In the FIG. 6 embodiment, a zero frequency 622 in plot 618 is marked by vertical axis 626. As discussed above, configuring loop filter 412 to establish a zero frequency in the loop filter transfer function is very important to prevent oscillation in PLL 218.

The "zero" occurs when plot 618 alters its course in a positive direction. In the FIG. 6 embodiment, the zero frequency may be defined by the following equation"

Zero Frequency=$1/(2\pi*Kp*C1/I_{CP,BPD})$

In the FIG. 6 embodiment, a high-frequency pole 630 in plot 630 is marked by vertical axis 634. The "pole" occurs when plot 630 alters its course in a negative direction. In the FIG. 6 embodiment, the high-frequency pole 630 is at a sufficiently high frequency to be negligible. Similar details for the transfer function characteristics during the PFD mode are provide below in conjunction with FIG. 8.

Figure 7:
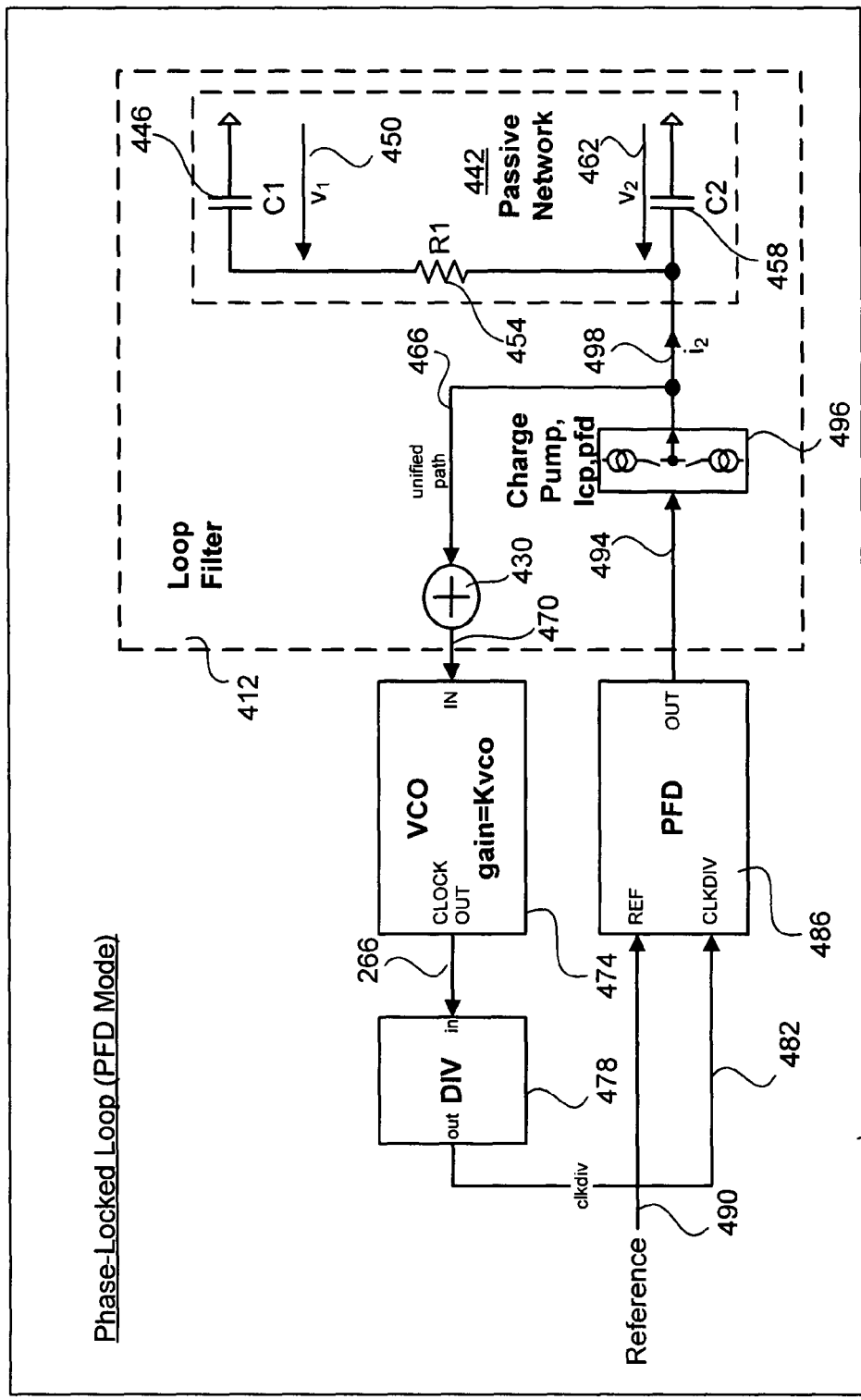
FIG. 7 is a schematic diagram for one embodiment of the phase-locked loop of FIG. 4 in a PFD mode, in accordance with the present invention.

Referring now to FIG. 7, a schematic diagram of the FIG. 4 phase-locked loop 218 in a PFD mode is shown, in accordance with one embodiment of the present invention. In alternate embodiments, the PFD mode may be implemented using components and configurations in addition to, or instead of, certain of those components and configurations discussed in conjunction with the FIG. 7 embodiment.

The FIG. 7 embodiment shows certain similarly-number components from the FIG. 4 PLL 218. However, for purposes of illustration, those components that are not currently active in the PFD mode have been removed from the FIG. 7 drawing. For example, in PFD mode, a lock detector circuit may deactivate BPD 414 (FIG. 4) and related components whenever BPD 414 is not currently operating within a specified pull-in range.

During the PFD mode, phase frequency detector (PFD) 486 receives a reference signal 490 from any appropriate source. PFD 486 also receives a divided clock signal 482 that is provided by divider 478 as a divided frequency of clock signal 266 from VCO 474. PFD 486 then generates a PFD output signal 494 that is provided through loop filter 412 to VCO 474 to bring the clock 266 within the pull-down range of the BPD 414 (FIG. 5).

In the FIG. 7 embodiment, the PFD output signal 494 controls a PFD charge pump 496 which provides PFD charge current 498 to passive network 442 that includes a primary capacitor C1 446, a damping resistor R1 454, and a secondary capacitor C2 462. In the FIG. 7 embodiment, PFD charge current 498 is provided to a first end of secondary capacitor C2 458, and a second end of secondary capacitor C2 458 is coupled to a ground connection. In the FIG. 7 embodiment, the first end of secondary capacitor C2 is also connected to a second end of damping resistor 454. The first end of damping resistor 454 is connected to a first end of primary capacitor C1 446, and the second end of primary capacitor C1 446 is coupled to the ground connection.

In PFD mode, a voltage $v_2$ 458 is provided from passive network 442 through a unified path 466 through summing node 430 to be provided as a VCO input signal 470 to control VCO 474. In the FIG. 7 embodiment, VCO 474 then utilizes the VCO input signal 470 to dynamically control/adjust its internal operating frequency to regenerate clock signal 266 with optimal timing characteristics that are within the range of BPD 414 (FIG. 5).

In the FIG. 7 embodiment, transfer function characteristics F(s) of loop filter 412 during PFD mode may be expressed by the following equation:

$$F_{PFDmode}(s) = \frac{V_{VCO,IN}}{V_{PFD,OUT}} = I_{CP,PFD}\left[\frac{1}{(C_1+C_2)s} \cdot \frac{1+R_1 C_1 s}{1} \cdot \frac{1}{1+R_1\frac{C_1 C_2}{C_1+C_2}s}\right]$$

where $V_{VCO,IN}$ is the VCO input signal 470, $V_{BPD,OUT}$ is the PFD output signal 494, and $I_{CP,PFD}$ is the PFD charge current 498.

In certain embodiments, when C1 446 is significantly greater than C2 458, then the foregoing equation may be simplified as follows:

$$F_{PFDmode}(s) = \frac{V_{VCO,IN}}{V_{PFD,OUT}} = \left[I_{CP,PFD}R_1 + \frac{I_{CP,PFD}}{C_1 s}\right]\frac{1}{1+R_1 C_2 s}$$

Therefore, during PFD mode, the equations exhibit a proportional term that may be expressed as $I_{CP,PFD}*R1$ to provide a "zero" that advantageously prevents oscillation in PLL 218. During PFD mode, the equations also exhibit an integrated term that may be expressed as $I_{CP,PFD}/(C1+C2)$. The implementation and utilization of PFD mode are further discussed below in conjunction with FIG. 8.

Referring now to FIG. 8, a graph illustrating exemplary loop filter characteristics for the FIG. 7 PFD mode is shown, in accordance with one embodiment of the present invention. The FIG. 8 graph is presented for purposes of illustration. In alternate embodiments, the present invention may readily utilize waveforms, timing relationships, and functionalities, in addition to, or instead of, certain of those waveforms, timing relationships, and functionalities discussed in conjunction with the FIG. 8 embodiment.

In the FIG. 8 embodiment, a loop filter transfer function in decibels is shown on a vertical axis, and frequency in a logarithmic scale is shown on a horizontal axis. For purposes of illustration, the FIG. 8 graph shows a transfer function with exemplary values for various components in the FIG. 7 PLL 218. For example, C1 is approximately equal to 1.45 nF, R1 is approximately equal to 600 ohms, C2 is approximately equal to 3 pF, PFD charge current 498 is approximately equal to 1 mA, the zero frequency is approximately equal to 183 KHz, and the high-frequency pole due to C2 458 is approximately equal to 88.602 MHz.

In the FIG. 8 embodiment, the integrator gain due to C1 (FIG. 7) is shown as plot 814. In addition, the loop filter transfer function of loop filter 412 is shown as plot 822, and is equal to the sum of the integrated term and the proportional term. In the FIG. 8 embodiment, a zero frequency 818 in plot 822 is marked by vertical axis 830. As discussed above, configuring loop filter 412 to establish a zero frequency in the loop filter transfer function is very important to prevent oscillation in PLL 218.

The "zero" occurs when plot 822 alters its course in a positive direction. In the FIG. 8 embodiment, the zero frequency may be defined by the following equation"

Zero Frequency=1/(2π*R1*C1)

In the FIG. 8 embodiment, a high-frequency pole 826 in plot 814 is marked by vertical axis 834. The "pole" occurs when plot 814 alters its course in a negative direction. In the FIG. 8 embodiment, the high-frequency pole 826 is at a sufficiently high frequency to be negligible. For all of the foregoing reasons, the present invention therefore provides an improved system and method for effectively implementing a dual-mode phase-locked loop to perform a data transmission procedure.

The invention has been explained above with reference to certain embodiments. Other embodiments will be apparent to those skilled in the art in light of this disclosure. For example, the present invention may readily be implemented using configurations and techniques other than those described in the embodiments above. Additionally, the present invention may effectively be used in conjunction with systems other than those described above. Therefore, these and other variations upon the discussed embodiments are intended to be covered by the present invention, which is limited only by the appended claims.

What is claimed is:

1. A system for utilizing a dual-mode phase-locked loop to support a data transmission procedure, comprising:
a voltage controlled oscillator that generates a receiver clock signal in response to VCO input signals;
a binary phase detector that generates a BPD output signal during a BPD mode by comparing input data and said receiver clock signal;
a phase frequency detector that generates a PFD output signal during a PFD mode by comparing a reference signal and a divided receiver clock signal; and
a loop filter that performs a BPD transfer function to generate a first one of said VCO input signals from said BPD output signal during said BPD mode, said loop filter performing a PFD transfer function to generate a second one of said VCO input signals from said PFD output signal during said PFD mode, said BPD mode summing a proportional path and an integrated path through said loop filter to generate said first one of said VCO input signals, said integrated path passing through a BPD charge pump and a passive component network, said passive component network including a primary capacitor, a damping resistor, and a secondary capacitor, said BPD output signal controlling said BPD charge pump which provides a BPD charge current to a first end of said primary capacitor, a second end of said primary capacitor being coupled to a ground connection, said first end of said primary capacitor also being connected to a first end of said damping resistor, a second end of said damping resistor being connected to a first end of said secondary capacitor, a second end of said secondary capacitor being coupled to said ground connection, transfer function characteristics F(s) of said loop filter during said BPD mode being expressed by a following equation:

$$F_{BPDmode}(s) = \frac{V_{VCO,IN}}{V_{BPD,OUT}} = K_P + I_{CP,BPD}\frac{1}{(C_1+C_2)s}\cdot\frac{1}{1+R_1\frac{C_1 C_2}{C_1+C_2}s}.$$

2. The system of claim 1 further comprising a lock detector circuit that switches said phase-locked loop between said BPD mode and said PFD mode.

3. The system of claim 2 wherein said BPD mode sums a proportional path and said integrated path through said loop filter to generate said first one of said VCO input signals.

4. The system of claim 3 wherein said proportional path passes through said dynamic gain adjustor that is dynamically controllable to specify bandwidth characteristics of said phase-locked loop.

5. The system of claim 3 wherein said integrated path passes through a BPD charge pump and a passive component network.

6. The system of claim 5 wherein said passive component network includes a primary capacitor, a damping resistor, and a secondary capacitor, said BPD output signal controlling said BPD charge pump which provides a BPD charge current to a first end of said primary capacitor, a second end of said primary capacitor being coupled to a ground connection, said first end of said primary capacitor also being connected to a first end of said damping resistor, a second end of said damping resistor being connected to a first end of said secondary capacitor, a second end of said secondary capacitor being coupled to said ground connection.

7. The system of claim 6 wherein values of said damping resistor and said secondary capacitor are selected to have a negligible effect in said passive component network during said BPD mode, a secondary capacitance of said secondary capacitor being selected to be approximately twenty times smaller than a primary capacitance of said primary capacitor.

8. The system of claim 1 wherein said PFD mode utilizes a unified path through said loop filter to generate said second one of said VCO input signals.

9. The system of claim 8 wherein said unified path passes through a PFD charge pump and a passive component network.

10. The system of claim 9 wherein said passive component network includes a primary capacitor, a damping resistor, and a secondary capacitor, said PFD output signal controlling said PFD charge pump which provides a PFD charge current to a first end of said secondary capacitor, a second end of said secondary capacitor being coupled to a ground connection, said first end of said secondary capacitor also being connected to a second end of said damping resistor, a first end of said damping resistor being connected to a first end of said primary capacitor, a second end of said primary capacitor being coupled to said ground connection.

11. The system of claim 10 wherein a secondary capacitance of said secondary capacitor is selected to be approximately twenty times smaller that a primary capacitance of said primary capacitor.

12. A system for utilizing a dual-mode phase-locked loop to support a data transmission procedure, comprising:

a voltage controlled oscillator that generates a receiver clock signal in response to VCO input signals;

a binary phase detector that generates a BPD output signal during a BPD mode by comparing input data and said receiver clock signal;

a phase frequency detector that generates a PFD output signal during a PFD mode by comparing a reference signal and a divided receiver clock signal; and a loop filter that performs a BPD transfer function to generate a first one of said VCO input signals from said BPD output signal during said BPD mode, said loop filter performing a PFD transfer function to generate a second one of said VCO input signals from said PFD output signal during said PFD mode, said PFD mode utilizing a unified path through said loop filter to generate said second one of said VCO input signals, said unified path passing through a PFD charge pump and a passive component network, transfer function characteristics F(s) of said loop filter during said PFD mode being expressed by a following equation:

$$F_{PFDmode}(s) = \frac{V_{VCO,IN}}{V_{VCO,OUT}} = I_{CP,PFD}\left[\frac{1}{(C_1+C_2)s} \cdot \frac{1+R_1C_1s}{1} \cdot \frac{1}{1+R_1\frac{C_1C_2}{C_1+C_2}s}\right].$$

13. The system of claim 12 wherein said loop filter is implemented with identical components to support both said BPD mode and said PFD mode, said loop filter exhibiting different filter characteristics in BPD mode and PFD mode.

* * * * *